United States Patent
Kusumi et al.

(10) Patent No.: US 7,300,712 B2
(45) Date of Patent: Nov. 27, 2007

(54) MAGNETIC SENSOR AND POSITION DETECTOR

(75) Inventors: Masaaki Kusumi, Kanagawa (JP); Mitsuru Ohno, Kanagawa (JP); Michio Okano, Kanagawa (JP); Hideki Nakamori, Saitama (JP); Touru Sumiya, Saitama (JP); Akitaka Tsunogae, Shizuoka (JP); Tomoyuki Nakada, Shizuoka (JP); Teruyuki Miura, Shizuoka (JP); Yoshihiko Ohkawara, Shizuoka (JP)

(73) Assignee: Sony Manufacturing Systems Corporation, Tokyo (JP)

( * ) Notice: Subject to any disclaimer, the term of this patent is extended or adjusted under 35 U.S.C. 154(b) by 183 days.

(21) Appl. No.: 10/689,754

(22) Filed: Oct. 20, 2003

(65) Prior Publication Data

US 2004/0157067 A1    Aug. 12, 2004

(30) Foreign Application Priority Data

Feb. 12, 2003    (JP)    ............................ P2003-033890

(51) Int. Cl.
*G11B 5/127*    (2006.01)
(52) U.S. Cl. .................... 428/814; 428/811.5; 428/815; 428/816; 360/110; 360/122
(58) Field of Classification Search ...................... None
See application file for complete search history.

(56) References Cited

U.S. PATENT DOCUMENTS

| | | | |
|---|---|---|---|
| 4,729,924 A * | 3/1988 | Skorjanec et al. .......... 428/422 |
| 4,755,426 A * | 7/1988 | Kokai et al. ................ 428/336 |
| 5,849,422 A * | 12/1998 | Hayashi ...................... 428/611 |
| 5,948,532 A * | 9/1999 | Hwang et al. .............. 428/408 |
| 6,517,956 B1 * | 2/2003 | Chen .......................... 428/668 |
| 6,680,112 B1 * | 1/2004 | Suzuki et al. ............ 428/833.4 |
| 2002/0008944 A1 | 1/2002 | Honma et al. .............. 360/313 |
| 2002/0114980 A1 * | 8/2002 | Gunsel et al. .............. 428/695 |
| 2002/0168550 A1 | 11/2002 | Onodera et al. ..... 428/694 TM |
| 2002/0186011 A1 | 12/2002 | Murata et al. .............. 324/252 |
| 2003/0076611 A1 * | 4/2003 | Usuki et al. .................. 360/17 |
| 2003/0228497 A1 * | 12/2003 | Wu et al. .............. 428/694 TP |

FOREIGN PATENT DOCUMENTS

JP    2001-82978    3/2001

* cited by examiner

*Primary Examiner*—Kevin M. Bernatz
(74) *Attorney, Agent, or Firm*—Haverstock & Owens LLP

(57) ABSTRACT

In a magnetic sensor (1) including a substrate (10) having a magnetism-sensitive element (11) formed thereon, a hard membrane (14) is formed on the outermost surface, an organic film (13) to relieve the stress caused by the hard membrane (14) is formed under the hard membrane (14), and an inorganic film (12) to relieve the stress caused by the organic film (13) is formed between the organic film (13) and magnetism-sensitive element (11). Also, an intermediate film formed from an element having a large force of bonding to carbon may be formed between the organic film (13) and hard membrane (14). Thus, the magnetic sensor (MR sensor, for example) can be protected against an external shock.

24 Claims, 3 Drawing Sheets

MAGNETIC SENSOR AND POSITION DETECTOR

BACKGROUND OF THE INVENTION

1. Field of the Invention

The present invention relates to a magnetic sensor and position detector for use on a machine tool, industrial machine or the like to detect the position thereof.

This application claims the priority of the Japanese Patent Application No. 2003-033890 filed on Feb. 12, 2003, the entirety of which is incorporated by reference herein.

2. Description of the Related Art

Presently, a sensor utilizing the magnetoresistance of a film of a ferromagnetic substance such as Fe—Ni, Ni—Co or the like, that is, the so-called MR (magnetoresistance) sensor, is used as a magnetic sensor in many cases. The MR sensor is formed from a substrate of glass, silicon, ceramic or the like on which there is formed a ferromagnetic film (of about 50 to 100 nm in thickness) on which a pattern of leads and connecting terminals for providing signals to outside is formed from a low-resistance metallic material by the photolithography. It should be noted that the MR sensors include an AMR sensor utilizing the anisotropic magnetoresistance (AMR), GMR sensor formed from a magnetic layer and multilayer film of nonmagnetic conductor and utilizing the giant magnetoresistance (GMR), TMR sensor formed from a magnetic layer and multilayer film of an insulative material and utilizing the tunnel magnetoresistance (TMR), etc.

The MR sensor has a resistance which varies depending upon an external magnetic field, and it is used to provide a magnetic head to reproduce a magnetic signal recorded in a magnetic recording medium, a magnetic sensor used on a machine tool, industrial machine or the like to detect the magnitude and direction of an external magnetic field, etc.

In a machine tool or the like, the MR sensor is disposed opposite to a magnetic recording medium having alternating fields recorded therein at an equal pitch or at a constant wavelength or having some pole pattern to be movable relative to the magnetic recording medium. Therefore, the MR sensor can detect a periodic signal (generally sinusoidal-wave signal) by detecting a fringing field caused by a magnetic recording medium having the alternating fields, for example. In the machine tool or the like, the MR sensor detects a linear travel, rotational travel, relative position, etc. by counting the period of the periodic signal or a linear travel, rotational travel, relative position, etc. with a resolution smaller than a pitch at which alternating fields are recorded in a magnetic recording medium by electrically sub-dividing the periodic signal in a predetermined manner.

Also, since the fringing field caused by a magnetic recording medium having alternating fields recorded therein with a small resolution or at a small pitch (several tens µm to several mm) for detection of a position or angle is weak, the MR sensor has to be nearer to the magnetic recoding medium to such an extent that the fringing field can be detected. Generally, the distance between the MR sensor and magnetic recording medium has to be smaller than the recording pitch, namely, about a quarter to a half of the recording wavelength. Thus, the MR sensor should be placed to face at the surface thereof the magnetic recording medium in order to detect the weak fringing field.

In the construction in which the MR sensor surface is opposite to the magnetic recording medium, a mechanical vibration or the like will possibly cause the MR sensor and magnetic recording medium into contact with each other, which is likely to damage the MR sensor. Conventionally, an inorganic film of silicon oxide or silicone nitride is formed on the MR sensor for protecting the surface of the MR sensor, and an organic film of a polymer such as polyimide resin or epoxy resin is further formed on the inorganic film, to protect the surface of the MR sensor. It should be noted that the organic film protects the MR sensor primarily against mechanical vibration or the like and the inorganic film protects the MR sensor primarily against application of the stress of the organic film to the MR sensor. Practically, the inorganic film is of about 0.5 to 2 µm in thickness and the organic film is of about 2 to 8 µm in case it is formed from the polyimide resin or of about 20 µm in case it is formed from the epoxy resin.

Further, it has been proposed to use a carbon membrane having a diamond-crystalline structure (DLC film) as the protective layer (see the cited reference 1, for example).

Note that the epoxy resin can be formed into a film thicker (20 µm) than a one formed from the polyimide resin and the epoxy resin film can more effectively protect the MR sensor against any external shock or the like. So, it is more preferable to use the epoxy resin film as the protective layer. However, if the protective layer formed on the MR sensor is too thick, the MR sensor surface will be excessively apart from the magnetic recording medium. On this account, the magnetic recording medium should be a one causing a fringing field having an strength detectable by the MR sensor. Therefore, a magnetic recording medium having magnetic signals recorded therein with a short magnetic recording wavelength cannot be used because it causes only a weak fringing field.

For example, a magnetic recording medium having magnetic signals recorded therein with a short magnetic recording wavelength of about 80 µm should be about 20 to 30 µm from the MR sensor surface. Therefore, in case such a magnetic recording medium having magnetic signals recorded therein with such a short magnetic recording wavelength is used, the protective layer on the MR sensor should be formed thin. However, a thin protective layer can protect the MR sensor only against a relatively weak external shock. If a strong external shock is applied to the MR sensor, the protective layer will be broken and thus the MR sensor will be damaged.

Generally, the MR sensor will be damaged in many cases during assembling into a position detector, machine tool or the like. In some cases, a spacer formed from a mylar film to an appropriate thickness is placed between a magnetic recording medium and MR sensor to set an appropriate distance, a so-called clearance, from the magnetic recording medium during assembling of the MR sensor into a position detector or machine tool, as the case may be. In this case, however, the protective layer will possibly be broken and MR sensor will thus be damaged when the spacer is pulled out after the MR sensor is fixed. In some cases, a scratch arisen in the protective layer but not being any problem when the spacer is pulled out will possibly cause the MR sensor to fail later.

Also, while a machine tool is in operation, a foreign matter such as dust or saw dust enters the above-mentioned clearance and damages the protective layer and MR sensor in other cases. This is because even a foreign matter somewhat larger than the clearance breaks in the protective layer which is formed on the uppermost surface of the MR sensor from a material (high polymer) softer than the foreign matter.

The Japanese Published Unexamined Patent Application No. 2001-82978 cited herein (Cited Reference No. 1) discloses a DLC film as such a protective layer. This DLC film is well known for its extremely strong stress. Therefore, if the DLC film is formed as it is on the MR sensor surface, the MR sensor is applied with a stress which will influence the magnetoresistance coefficient (MR ratio) of the MR sensor. Especially, if the DLC film is formed on an MR sensor formed from a ferromagnetic film of Fe—Ni or Ni—Co by the method disclosed in the Cited Reference No. 1, the MR sensor will have the magnetoresistance coefficient (MR ratio) deteriorated and cannot perform to the full extent as a sensor.

Currently, the DLC film is generally formed by the ion plating, CVD method or the like. Carbon films each containing carbon as the base, produced by these methods, will have an amorphous structure. Therefore, the protective layer stated in the Cited Reference No. 1 (DLC film: carbon membrane having a diamond-crystalline structure) can hardly be formed by these methods.

Also, the HDD (hard disk drive) and the like use the MR sensor as a magnetic head. For protection against damage due to sliding on a disk, some of such magnetic heads have a DLC film formed on the surface thereof which is in contact with the disk. In the HDD, the DLC film is formed on the surface of the magnetic head which is in contact with a disk in the HDD, not directly on the MR sensor surface, as shown in FIG. 1. Therefore, in the HDD, the DLC film is formed on the magnetic head surface with no consideration to the stress of the DLC film. Also, the DLC films used in such applications has a thickness of several nm to several tens nm and thus they are of no use as a protective layer for an MR sensor intended for use as a sensor.

REFERENCES CITED HEREIN

1. Japanese Published Unexamined Patent Application No. 2001-82978

OBJECT AND SUMMARY OF THE INVENTION

It is therefore an object of the present invention to overcome the above-mentioned drawbacks of the related art by providing a magnetic sensor including an MR sensor formed from a ferromagnetic film of Fe—Ni or Ni—Co and having formed thereon a DLC film having a reduced stress and a position detector to provide a sensor structure having an improved resistance against an external shock.

The above object can be attained by providing a magnetic sensor including a substrate having a magnetism-sensitive element formed thereon and which detects a magnetic signal from a medium having magnetic signals recorded thereon, the magnetic sensor including, according to the present invention, an inorganic film formed on the magnetism-sensitive element; an organic film formed on the inorganic film; and a hard membrane formed on the organic film, wherein the magnetic sensor has the hard membrane disposed opposite to the medium, and relatively moves along the medium.

The above object can be attained by providing a position detector comprising a magnetic scale with position signals longitudinally provided thereon; and a magnetic sensor including a substrate having a magnetism-sensitive element formed thereon, an inorganic film formed on the magnetism-sensitive element, an organic film formed on the inorganic film, and a hard membrane formed on the organic film; wherein the magnetic sensor has the hard membrane disposed opposite to the magnetic scale, and relatively moves along the magnetic scale to detect position signals provided on the magnetic scale.

In the above magnetic sensor according to the present invention, the inorganic film, organic film and hard membrane formed as protective films on the magnetism-sensitive element assure an improved resistance against an external shock as compared with the conventional magnetic sensors, and the magnetism-sensitive element will not be given any distortion caused by the stress of the protective films, so that the magnetic sensor according to the present invention is equal in sensor characteristics such as magnetoresistance coefficient (MR ratio) to the conventional magnetic sensors.

Also in the above magnetic sensor according to the present invention, the thin protective films including the hard membrane are formed on the magnetism-sensitive element. So, the magnetic sensor is usable in combination with a magnetic recording medium having magnetic signals recorded therein with a short magnetic recording wavelength and a clearance which assures no scratch of the magnetism-sensitive element can be set when combining the magnetic sensor with the magnetic recording medium.

Also in the above magnetic sensor according to the present invention, the thin protective films including the hard membrane are formed on the magnetism-sensitive element. So, no foreign matter having a larger size than a clearance set with the magnetic sensor being combined with a magnetic recording medium can intrude into the clearance, and the hard membrane can protect the magnetism-sensitive element even if any foreign matter having a size equal to or less than that of the clearance intrudes into the clearance.

Also, the above position detector according to the present invention comprises a magnetic scale having position signals provided thereon longitudinally thereof, and a magnetic sensor having the inorganic film, organic film and hard membrane formed as protective films on the magnetism-sensitive element. The magnetic sensor has the hard membrane disposed opposite to the magnetic scale, and moves along the magnetic scale to detect position signals provided on the magnetic scale. Accordingly, an improved resistance against an external shock is assured as compared with the conventional position detector, and the magnetism-sensitive element will not be given any distortion caused by the stress of the protective films, so that the position detector according to the present invention is equal in sensor characteristics such as magnetoresistance coefficient (MR ratio) to the conventional magnetic sensors.

Also in the above position detector according to the present invention, the thin protective films including the hard membrane are formed on the magnetism-sensitive element of the magnetic sensor. So, the magnetic sensor is usable in combination with a magnetic recording medium having magnetic signals recorded therein with a short magnetic recording wavelength and a clearance which assures no scratch of the magnetism-sensitive element can be set when combining the magnetic sensor with the magnetic recording medium.

Also in the above position detector according to the present invention, the thin protective films including the hard membrane are formed on the magnetism-sensitive element of the magnetic sensor. So, no foreign matter having a larger size than a clearance set with the magnetic sensor being combined with a magnetic recording medium can intrude into the clearance, and the hard membrane can protect the magnetism-sensitive element even if any foreign matter having a size equal to or less than that of the clearance intrudes into the clearance.

These objects and other objects, features and advantages of the present invention will become more apparent from the following detailed description of the preferred embodiments of the present invention when taken in conjunction with the accompanying drawings.

DETAILED DESCRIPTION OF THE PREFERRED EMBODIMENTS

The magnetic sensor according to the present invention will be described below concerning the embodiments thereof with reference to the accompanying drawings.

The present invention is applied to a magnetic sensor which detects the strength or the like of a magnetic field on the basis of the magnetoresistance. The magnetic sensor includes a substrate of glass, silicon, ceramic or the like on which there is formed a ferromagnetic film on which a pattern of leads and connecting terminals for providing signals to outside is formed from a low-resistance metallic material by the photolithography. According to the present invention, the magnetic sensor, generally indicated with a reference number 1, has a predetermined protective film formed on the ferromagnetic film in order to protect the ferromagnetic film against an external shock or the like. The magnetic sensor 1 of the first structure will be described below with reference to FIG. 2, a sectional view of the magnetic sensor 1.

Figure 1:
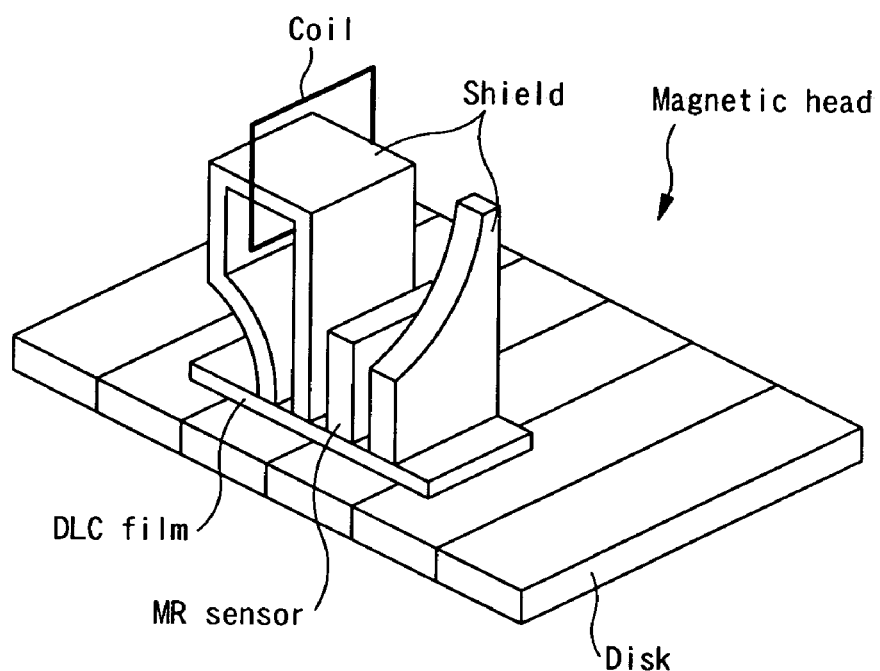
FIG. 1 schematically illustrates the magnetic head formed form an MR sensor and having a DLC film formed on the side thereof which is in contact with a disk and in which the MR sensor is disposed on the surface perpendicular to the disk.
Figure 2:
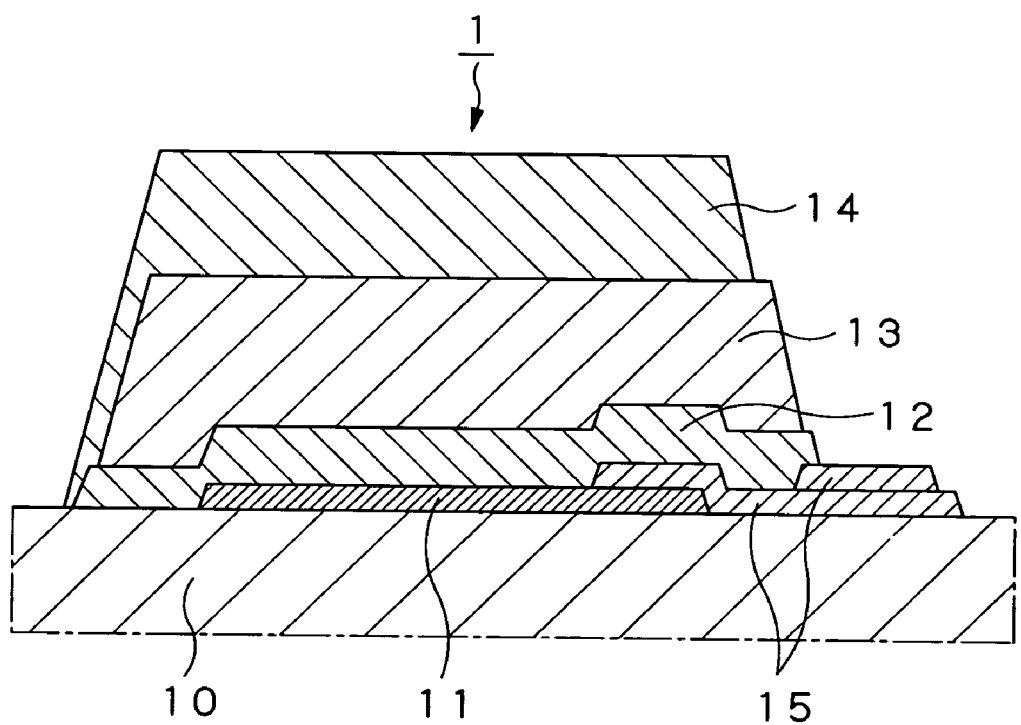
FIG. 2 is a sectional view of the magnetic sensor according to the present invention, showing a first structure of the magnetic sensor.

As shown in FIG. 2, the magnetic sensor 1 includes an Si substrate 10 having provided thereon an Fe—Ni film 11 formed as an MR film to a thickness of about several tens nm, a nitride film formed as an inorganic film 12 on the Fe—Ni film 11 to a thickness of about 100 to 3000 nm, a polyimide resin layer formed as an organic film 13 on the nitride film to a thickness of several μm, and a hard membrane 14 formed on the polyimide resin layer to a thickness of 0.1 to 5 μm. Also, the magnetic sensor 1 has provided thereon a pattern of electrodes 15 including leads and connecting terminals for providing signals to outside. The pattern of electrodes 15 is formed from a low-resistance metallic material by the photolithography. It should be noted that the electrodes 15 are of about 1000 nm in thickness.

Figure 3:
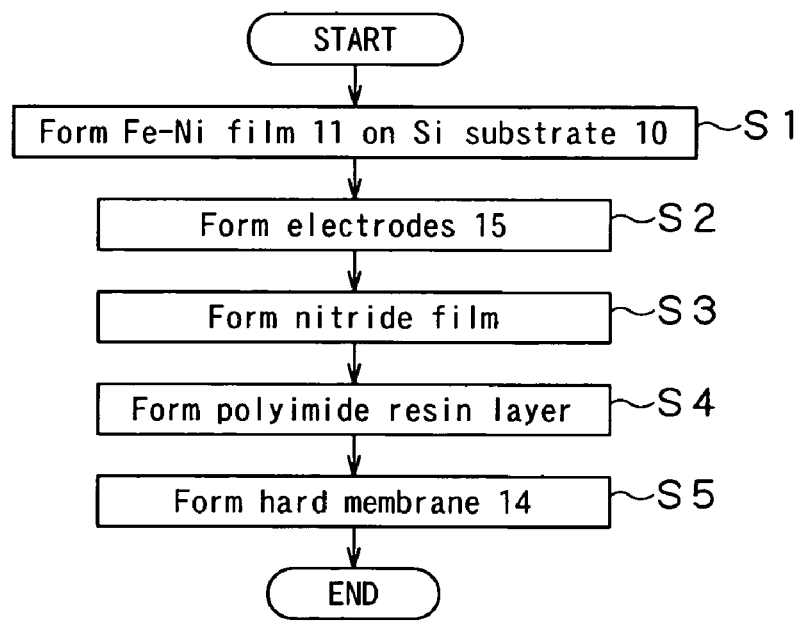
FIG. 3 shows a flow of steps included in the process of producing the magnetic sensor shown in FIG. 2.

The magnetic sensor 1 is produced as will be described in detail with reference to the flow chart in FIG. 3. First, the Fe—Ni film 11 is formed on the Si substrate 10 to the thickness of several tens nm to form a pattern by the photolithography (in step S1), and then the pattern of electrodes 15 is similarly formed (in step S2). Thereafter, the nitride film is formed to the thickness of 100 to 3000 nm by the CVD (chemical vapor deposition) method (in step S3), and then the polyimide resin layer is formed to the thickness of several μm (in step S4). Further, the hard membrane 14 is formed on the polyimide resin layer to the thickness of 0.1 to 5 μm (in step S5). It should be noted that the hard membrane 14 is formed on the polyimide resin layer from a film of amorphous carbon hydride containing C and H as the bases (will be referred to as "DLC film" hereinafter) by a plasma CVD apparatus. Also, an area where no DLC film is to be formed may be masked for no film to be formed there.

The technical significance of the protective layer will be discussed here. The protective layer should desirably be low in stress while being high in hardness. If the inorganic film 12 causes a high stress, a film formed thereon will be distorted due to the stress, resulting in a deterioration of the MR characteristic of the magnetic sensor 1. If the protective layer is not highly hard, it will not perform to the full extent. In the magnetic sensor 1 according to the present invention, the protective layer is formed on the Fe—Ni film 11 from the three-layer structure of the inorganic film 12, organic film 13 and DLC film. It should be noted that according to the present invention, the inorganic film 12 is formed from the nitride film and the organic film 13 is formed from the polyimide resin.

The nitride film shows a low stress to the Fe—Ni film 11 and has a relatively high hardness. Further, the nitride film is also excellent in electrical resistance and moisture resistance. However, an excessive thickness of the nitride film will add to the stress to the Fe—Ni film 11, and thus deteriorate the MR characteristic of the Fe—Ni film 11. Also, an increased time for film forming adds to the costs. For this reason, the nitride film should preferably be on the order of 100 to 3000 nm as above. However, this thickness cannot assure a sufficient shock resistance. On this account, the polyimide resin layer is formed as the organic film 13 on the nitride film. It should be noted that the nitride film has also a function of absorbing the stress caused by the polyimide resin layer so that the stress will not have any influence on the Fe—Ni film 11.

In the magnetic sensor 1 according to the present invention, the DLC film is formed on the organic film 13 to improve the shock resistance. It should be noted that since the polyimide resin layer is softer than the nitride film, it will absorb the stress caused by the DLC film. Therefore, the Fe—Ni film 11 will not adversely be affected by the stresses of the polyimide resin layer and DLC film.

Since the magnetic sensor 1 constructed as above has formed on the Fe—Ni film 11 the protective layer consisting of the nitride film, polyimide resin layer and DLC film, so it is highly resistant against an external shock as compared with the conventional magnetic sensor (including a nitride film of 100 to 3000 nm in thickness and a polyimide resin layer of several μm). Also in the magnetic sensor 1, the stress caused by the polyimide resin layer is relieved by the nitride film and that caused by the DLC film is relieved by the polyimide resin layer. Thus, the magnetic sensor 1 can work well with the Fe—Ni film 11 not being influenced by the stress of the protective layer and with a sensor characteristic such as magnetoresistance coefficient (MR ratio) etc. being comparable with the conventional magnetic sensors.

Figure 4:
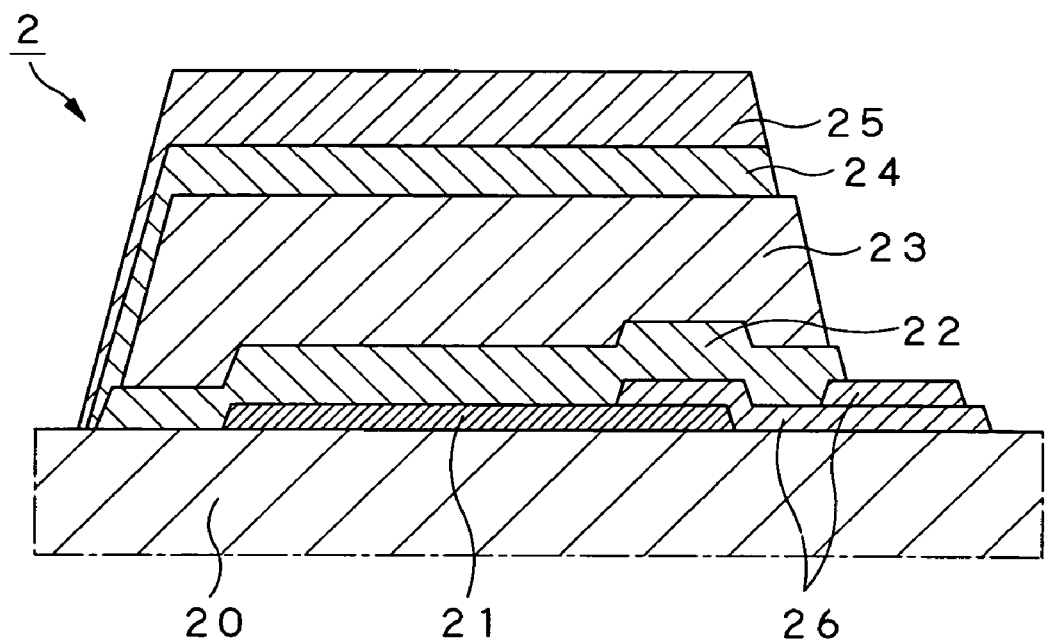
FIG. 4 is a sectional view of the magnetic sensor according to the present invention, showing a second structure of the magnetic sensor.

Next, the magnetic sensor of the second structure will be described below with reference to FIG. 4, a sectional view of the magnetic sensor.

The magnetic sensor having the second structure is generally indicated with a reference number 2. It includes an Si substrate 20, and has an Fe—Ni film 21 formed as the MR film on the Si substrate 20 to a thickness of about several tens nm, a nitride film formed as an inorganic film 22 on the Fe—Ni film 21 to a thickness of about 100 to 3000 nm, a polyimide resin layer formed as an organic film 23 on the nitride film to a thickness of several μm, and an intermediate film 24 formed on the polyimide resin layer to a thickness of 3 μm to join the polyimide resin layer and hard membrane 25 to each other, and the hard membrane 25 formed on the intermediate film 24 to a thickness of 1 μm. It should be noted that the intermediate film 24 is also a kind of the hard membrane 25. Also in the magnetic sensor 2, a pattern of electrodes 26 including leads and connecting terminals for providing signals to outside is formed from a low-resistance metallic material by the photolithography. It should be noted that the electrodes 26 are formed to have a thickness of about 1000 nm.

Figure 5:
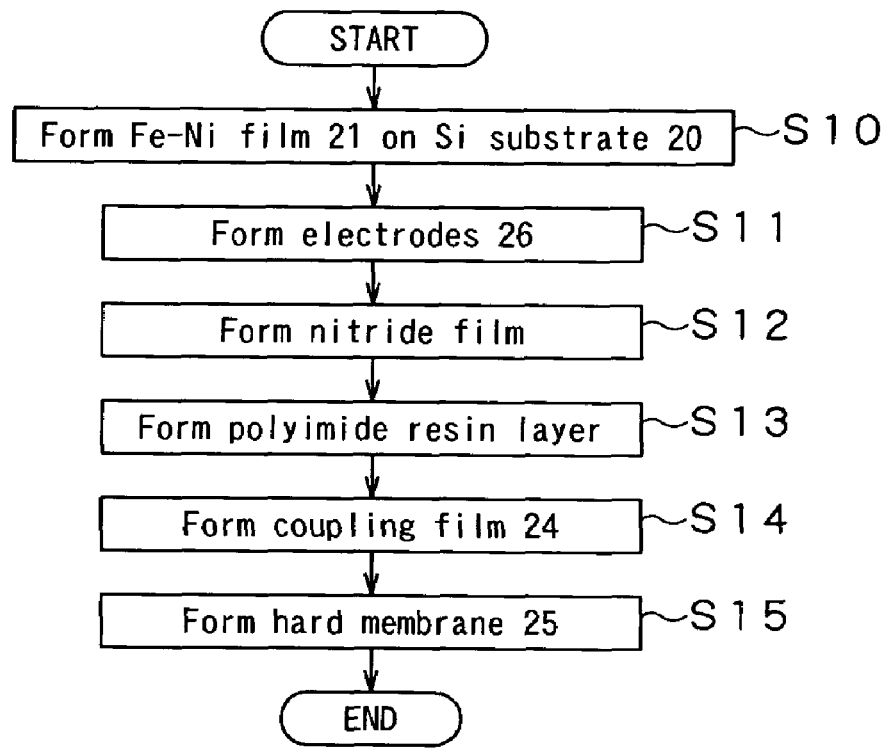
FIG. 5 shows a flow of steps includes in the process of producing the magnetic sensor shown in FIG. 4.

The magnetic sensor 2 is produced as will be described in detail with reference to the flow chart in FIG. 5. First, the Fe—Ni film 21 is formed on the Si substrate 20 to the thickness of about several tens nm, and after the pattern is formed by the photolithography (in step S10), the pattern of electrodes 26 is similarly formed (in step S11). Thereafter, the nitride film is formed to the thickness of 100 to 3000 nm by the CVD (chemical vapor deposition) method (in step S12), and then the polyimide resin layer is formed to the thickness of several μm (in step S13). Then, the intermediate film 24 for joining the polyimide resin layer and hard membrane 25 to each other is formed on the polyimide resin layer to the thickness of 1 μm (in step S14). The intermediate film 24 contains Si, C, O and H and so well bonds to the hard membrane 25 containing C (carbon) as the base. Therefore, forming of the intermediate film 24 between the polyimide resin layer and hard membrane 25 advantageously assures an improved bonding between the films as compared with forming of the hard membrane 25 directly on the polyimide resin layer. Also, the intermediate film 24 (containing Si, C, O and H) is a kind of the hard membrane 25 showing a low stress while not being so hard as the DLC film.

In step S15, the hard membrane 25 is formed on the intermediate film 24 to the thickness of 0.1 to 5 μm. It should be noted that a plasma CVD apparatus is used to form the intermediate film 24 and hard membrane 25. The plasma CVD apparatus will first form the intermediate film 24 containing Si, C, O and H on the polyimide resin layer, and gradually changing the material gas from one to another, it continuously forms the DLC film. Also, an area where no DLC film is to be formed may be masked for no film to be formed there.

The technical significance of the protective layer will not be discussed here since it has previously been explained.

The intermediate film may have mixed therein any one or more of elements forming carbides of Si, Ti, Cr, W and Ta. Mixing of such element in the intermediate film will reduce the hardness of the intermediate film but permits to considerably reduce the stress caused by the intermediate film. Therefore, a thick hard membrane can be formed on the polyimide resin layer, thus permitting to protect the Fe—Ni film 21 against any larger shock.

The magnetic sensor 2 constructed as above has formed on the Fe—Ni film 21 the protective layer consisting of the nitride film, polyimide resin layer, intermediate film 24 (Si, C, O and H) and DLC film. So, it is highly resistant against an external shock as compared with the conventional magnetic sensor (including a nitride film of 100 to 3000 nm in thickness and a polyimide resin layer of several μm). Also in the magnetic sensor 1, the stress caused by the polyimide resin layer is relieved by the nitride film and that caused by the intermediate film 24 and DLC film is relieved by the polyimide resin layer. Thus, the magnetic sensor 2 can work well with the Fe—Ni film 21 not being influenced by the stress of the protective layer and with a sensor characteristic such as magnetoresistance coefficient (MR ratio) etc. being comparable with the conventional magnetic sensors. Moreover, the magnetic sensor 2 has the DLC film formed thinner for the intermediate film 24 (Si; C, O and H), and so it can be produced in a shorter time. Also, in the magnetic sensor 2, the hard membrane 25 is contiguous from the intermediate film 24 (Si, C, O and H) to the DLC film, and so it can incur a stress smaller than that which would be in a magnetic sensor in which the hard membrane 25 is all the DLC film.

A magnetic position detector in which the aforementioned magnetic sensor 1 or 2 is used as a detection head will be described below as an application with reference to FIG. 6.

Figure 6:
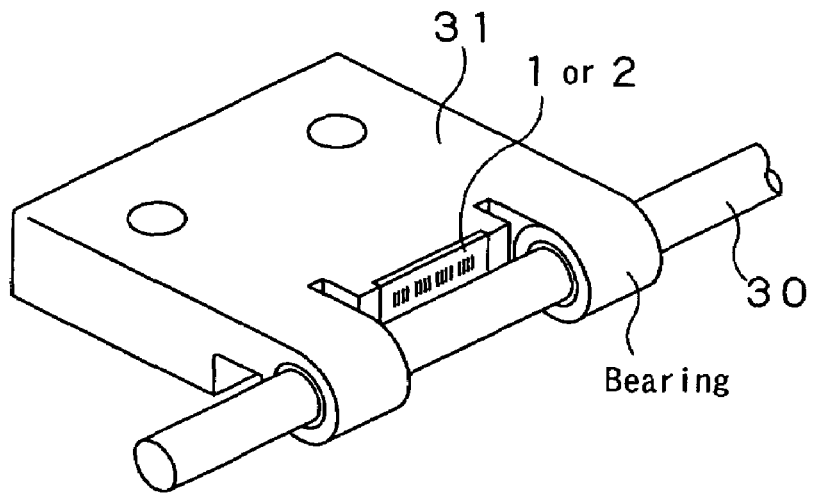
FIG. 6 schematically illustrates a magnetic position detector including the magnetic sensor according to the present invention.

As shown in FIG. 6, the magnetic position detector, generally indicated with a reference number 3, includes a cylindrical magnetic scale 30 magnetized at equal pitches longitudinally thereof to have position signals provided thereon, a head holder 31 disposed opposite to the magnetic scale 30 and movable longitudinally of the magnetic scale 30 and relative to the latter. The head holder 31 incorporates the magnetic sensor 1 or 2 to detect a fringing field from the magnetic scale 30, and an FPC (flexible printed circuit) (not shown) which sends the signal detected by the magnetic sensor 1 or 2 to a signal processor which processes the received detection signal in a predetermined manner. It should be noted that in the magnetic position detector 3, the magnetic scale 30 is inserted from one side of the head holder 31 through a bearing and thus assembled in the head holder 31. Also, the magnetic sensor 1 or 2 is disposed in place on the head holder 31 to detect a fringing field from the magnetic scale 30, and fixed there with an adhesive or the like.

In the magnetic position detector 3, a fringing field caused by the magnetic scale 30 is detected by the magnetic sensor 1 or 2, the detection signal is converted on the basis of the detected fringing field, the converted signal is sent to the signal processor via the FPC, and a direction and travel, for example, of the head holder 31 is determined by the signal processor on the basis of the received signal.

In the magnetic position detector 3 constructed as above according to the present invention, since the thin protective layer including the hard membrane is formed on the magnetic sensor 1 or 2 disposed on the head holder 31, the clearance between the magnetic sensor 1 or 2 and the magnetic scale 30 can be set narrow. Therefore, the magnetic position detector 3 according to the present invention can use the magnetic scale 30 having magnetic signals recorded thereon with a short magnetic recording wavelength and thus can detect a linear travel, rotational travel, relative position and the like with a high accuracy.

In the magnetic position detector 3 according to the present invention, since the thin protective layer including the hard membrane is formed on the magnetic sensor 1 or 2 disposed on the head holder 31, a clearance between the magnetic sensor 1 or 2 and the magnetic scale 30 can be set by pulling out a spacer without scratching the magnetic sensor 1 or 2 when assembling the head holder 31. Also, the magnetic position detector 3 can work with the magnetic sensor 1 or 2 not being damaged even with a strong external shock.

Further, in the magnetic position detector 3 according to the present invention, since the protective layer including the hard membrane is formed on the magnetic sensor 1 or 2, no foreign matter larger in size than the clearance will intrude into the clearance, and a foreign matter of a size equal to or smaller than that of the clearance, if any having intruded into the clearance, cannot damage the magnetic sensor 1 or 2 since the latter is protected by the hard membrane.

The magnetic sensor 1 or 2 according to the present invention uses, as a material for the substrate, silicon which is excellent in heat conduction, but the substrate material may be glass or ceramic ($Al_2O_3$).

Also, the thickness of the Fe—Ni film is not limited to the aforementioned ones because it depends upon the characteristics of magnetic signals to be detected by the Fe—Ni film. Generally, it is on the order of 10 to 150 nm.

Also, the type, thickness, etc. of the electrodes are not limited to the aforementioned ones. The electrodes may be formed under the Fe—Ni film although they are formed on the Fe—Ni film in the above embodiment.

In the aforementioned embodiment, the nitride film is used as the inorganic film but the latter may be of SiO, $SiO_2$ or the like. Also, the organic film may be formed from polyamide resin, epoxy resin or the like, not the polyimide resin. The hard membrane should preferably be a DLC film in views of the hardness and slidability, but it may be formed from TiN, CrN, SiC, $Al_2O_3$, AlN or the like. Also the intermediate film may be of SiC, Ti, Cr or the like, not a mixture of Si, C, O and H.

Also, the thickness of each film included in the magnetic sensor 1 or 2 according to the present invention is an arbitrarily settable item. Actually, it is set appropriately depending upon a distance, namely, clearance, between the magnetic sensor 1 or 2 and an object to be detected, which is to be set during installing of the magnetic sensor 1 or 2 to a machine tool or the like, and costs of manufacturing the magnetic sensor 1 or 2.

Also, the protective layer formed in the magnetic sensor 1 or 2 according to the present invention is not limited to the aforementioned embodiments but it may be formed on a thin magnetic sensor such as a GMR sensor of an artificial lattice structure, spin bulb type, TMR sensor or thin magnetic impedance (MI) sensor or the like.

Also, the magnetic position detector 3 adopting the magnetic sensor 1 or 2 according to the present invention is not limited to any linear type but it may be a rotary encoder, fixed-spot detection type magnetic sensor, or the like.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

What is claimed is:

1. A magnetic sensor including a substrate having a magnetism-sensitive element formed thereon and which detects a magnetic signal from a medium having magnetic signals recorded thereon, the magnetic sensor having:
   an inorganic film formed on the magnetism-sensitive element to a thickness between 100 nm to 3000 nm;
   an organic film formed on the inorganic film; and
   a membrane formed on the organic film,
   wherein said magnetic sensor has said membrane disposed opposite to the medium, and relatively moves along said medium.

2. The magnetic sensor as set forth in claim 1, wherein the membrane is of amorphous carbon hydride (will be referred to as "DLC film" hereinafter).

3. The magnetic sensor as set forth in claim 1, wherein the inorganic film comprises a nitride film.

4. The magnetic sensor as set forth in claim 1, having an intermediate film formed between the organic film and the membrane.

5. The magnetic sensor as set forth in claim 4, wherein the intermediate film has mixed therein any one or more of Si, Ti, Cr, W and Ta wherein the one or more of Si, Ti, Cr, W and Ta bond with carbon.

6. The magnetic sensor as set forth in claim 4, wherein the intermediate film is formed from Si, C, O and H.

7. The magnetic sensor as set forth in claim 4, wherein the boundary between the intermediate film and the membrane has a structure in which the components vary continuously.

8. A position detector comprising:
   a magnetic scale with position signals longitudinally provided thereon; and
   a magnetic sensor including a substrate having a magnetism-sensitive element formed thereon, an inorganic film formed on the magnetism-sensitive element to a thickness between 100 nm to 3000 nm, an organic film formed on the inorganic film, and a membrane formed on the organic film;
   wherein said magnetic sensor has said membrane disposed opposite to the magnetic scale, and relatively moves along the magnetic scale to detect position signals provided on the magnetic scale.

9. The position detector as set forth in claim 8, wherein the membrane is of amorphous carbon hydride (will be referred to as "DLC film" hereinafter).

10. The position detector as set forth in claim 8, wherein the inorganic film comprises a nitride film.

11. The position detector as set forth in claim 8, having an intermediate film formed between the organic film and the membrane.

12. The position detector as set forth in claim 11, wherein the intermediate film has mixed therein any one or more of Si, Ti, Cr, W and Ta wherein the one or more of Si, Ti, Cr, W and Ta bond with carbon.

13. The position detector as set forth in claim 11, wherein the intermediate film is formed from Si, C, O and H.

14. The position detector as set forth in claim 11, wherein the boundary between the intermediate film and the membrane has a structure in which the components vary continuously.

15. A magnetic sensor including a substrate having a magnetism-sensitive element formed thereon and which detects a magnetic signal from a medium having magnetic signals recorded thereon, the magnetic sensor having:
    an inorganic film formed on the magnetism-sensitive element to a thickness between 100 nm to 3000 nm;
    an organic film formed on the inorganic film; and
    an amorphous carbon hydride membrane formed on the organic film to a thickness of 0.1 µm to 5 µm,
    wherein said magnetic sensor has said amorphous carbon hydride membrane disposed opposite to the medium, and moves relatively along said medium.

16. The magnetic sensor as set forth in claim 15, wherein the inorganic film comprises a nitride film.

17. A magnetic sensor including a substrate having a magnetism-sensitive element formed thereon and which detects a magnetic signal from a medium having magnetic signals recorded thereon, the magnetic sensor having:
    an inorganic film formed on the magnetism-sensitive element to a thickness between 100 nm to 3000 nm;
    an organic film formed on the inorganic film;
    an intermediate film formed on the organic film; and a membrane formed on the intermediate film to a thickness of 0.1 μm to 5 μm wherein said magnetic sensor has said membrane disposed opposite to the medium, and moves relatively along said medium.

18. The magnetic sensor as set forth in claim 17, wherein said membrane is formed from the group consisting of diamond-like carbon, TiN, CrN, SiC, $Al_2O_3$ and AlN.

19. The magnetic sensor as set forth in claim 17, wherein the inorganic film comprises a nitride film.

20. A position detector comprising:

a magnetic scale with position signals longitudinally provided thereon; and a magnetic sensor including a substrate having a magnetism-sensitive element formed thereon, an inorganic film formed on the magnetism-sensitive element to a thickness between 100 nm to 3000 nm, an organic film formed on the inorganic film, and an amorphous carbon hydride membrane formed on the organic film to a thickness of 0.1 μm to 5 μm;

wherein said magnetic sensor has said amorphous carbon hydride membrane disposed opposite to the magnetic scale, and moves relatively along the magnetic scale to detect position signals provided on the magnetic scale.

21. The position detector as set forth in claim 20, wherein the inorganic film comprises a nitride film.

22. A position detector comprising:

a magnetic scale with position signals longitudinally provided thereon; and a magnetic sensor including a substrate having a magnetism-sensitive element formed thereon, an inorganic film formed on the magnetism-sensitive element to a thickness between 100 nm to 3000 nm, an organic film formed on the inorganic film, an intermediate film formed on the organic film and a membrane formed on the intermediate film to a thickness of 0.1 μm to 5 μm;

wherein said magnetic sensor has said membrane disposed opposite to the magnetic scale, and moves relatively along the magnetic scale to detect position signals provided on the magnetic scale.

23. The position detector as set forth in claim 22, wherein said membrane is formed from the group consisting of diamond-like carbon, TiN, CrN, SiC, $Al_2O_3$ and AlN.

24. The position detector as set forth in claim 22, wherein the inorganic film comprises a nitride film.

* * * * *